United States Patent
Choi et al.

(10) Patent No.: US 10,048,584 B2
(45) Date of Patent: Aug. 14, 2018

(54) THINNER COMPOSITION

(71) Applicant: DONGWOO FINE-CHEM CO., LTD., Jeollabuk-do (KR)

(72) Inventors: Cheol Min Choi, Jeollabuk-do (KR); In Kak Song, Jeollabuk-do (KR); Kyong Ho Lee, Gyeonggi-do (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 0 days.

(21) Appl. No.: 15/251,003

(22) Filed: Aug. 30, 2016

(65) Prior Publication Data

US 2017/0059987 A1   Mar. 2, 2017

(30) Foreign Application Priority Data

Sep. 1, 2015  (KR) .................. 10-2015-0123395

(51) Int. Cl.
  G03F 7/004   (2006.01)
  G03F 7/039   (2006.01)
  G03F 7/038   (2006.01)

(52) U.S. Cl.
  CPC ............ G03F 7/0048 (2013.01); G03F 7/038 (2013.01); G03F 7/039 (2013.01)

(58) Field of Classification Search
  CPC ................................ G03F 7/325; G03F 7/0048
  USPC ............................................... 430/270.1, 331
  See application file for complete search history.

(56) References Cited

U.S. PATENT DOCUMENTS

| | | | | |
|---|---|---|---|---|
| 2003/0194654 A1* | 10/2003 | Toshimitsu | ........... | B41C 1/1008 430/302 |
| 2012/0219755 A1* | 8/2012 | Bae | ........................ | G03F 7/325 428/141 |
| 2014/0120470 A1* | 5/2014 | Pohlers | ..................... | G03F 7/20 430/270.1 |
| 2015/0185615 A1* | 7/2015 | Park | ........................ | G03F 7/38 430/315 |

FOREIGN PATENT DOCUMENTS

KR   10-2011-0021189 A   3/2011

* cited by examiner

*Primary Examiner* — John S Chu
(74) *Attorney, Agent, or Firm* — The PL Law Group, PLLC

(57) ABSTRACT

A thinner composition includes propyleneglycol alkylether acetate, cycloketone, and methyl 2-hydroxy isobutyrate. The thinner composition has excellent EBR, RRC, and rework properties, as well as effects of improving photoresist application uniformity, and in particular, exhibiting excellent solubility to photoresist having a high polarity, so as to be applicable to various photoresists.

8 Claims, 3 Drawing Sheets

THINNER COMPOSITION

CROSS REFERENCE TO RELATED APPLICATIONS

The application claims the benefit of Korean Patent Application No. 10-2015-0123395, filed on Sep. 1, 2015, at the Korean Intellectual Property Office, the disclosures of which are incorporated herein in their entirety by reference.

BACKGROUND

1. Field of the Invention

The present invention relates to a thinner composition.

2. Description of the Related Art

A photolithography process in a method for manufacturing a semiconductor device is one of important works, which includes applying a photosensitive resin composition to a wafer, transferring a pre-designed pattern thereto, and then suitably etching according to transferred pattern to thus form an electronic circuit.

Such a photolithography process may be sequentially conducted by: (1) a coating process of uniformly applying a photosensitive resin composition to a surface of the wafer; (2) a soft baking process of evaporating a solvent from the applied photosensitive film to adhere the photosensitive film to the surface of the wafer; (3) an exposure process of exposing the photosensitive film while repeatedly and sequentially conducting reduction projection of the circuit pattern on a mask using a light source such as ultraviolet rays, to thus transfer the pattern of the mask to the photosensitive film; (4) a development process of selectively removing some portions having different physical properties such as a difference in solubility occurred due to sensitization by exposure to the light source, using a developer; (5) a hard baking process of closely fixing the photosensitive film, which remains on the wafer after the development, to the wafer; (6) an etching process of etching a predetermined portion according to patterns of the developed photosensitive film; and (7) a stripping process of removing undesirable photosensitive film after the above processes, in this order.

Among the above photolithography processes, the spin coating process of providing the photosensitive film on a wafer and rotating the substrate to evenly spread the photosensitive film on the surface by a centrifugal force, may cause the photosensitive film to be gathered at an edge portion and a rear portion of the substrate due to the centrifugal force, to thus form a small spherical material. The spherical material may be peeled off during delivery of the substrate after the baking process, hence becoming a cause of particles in the apparatus, and also becoming a cause of defocus during exposure. Such undesirable photosensitive material may bring about contamination of an apparatus, hence reducing yield in the process for manufacturing the semiconductor device. Therefore, the undesirable photosensitive material is usually removed by installing injection nozzles at up and down of the edge portion and the rear portion of the substrate and injecting a thinner composition including an organic solvent component to the edge portion and the rear portion through the injection nozzles.

Factors of determining the performance of the thinner composition may include a rate of dissolution ('dissolution rate') and volatility thereof. The dissolution rate of the thinner composition determines how quickly and effectively dissolves and removes the photosensitive resin by the thinner composition, therefore, is very important factor. Specifically, when rinsing the edge portion of the substrate, a suitable dissolution rate is required to provide a smoothly treated cross-section. If the dissolution rate is too high, a photosensitive film attack may occur in rinsing the photosensitive film coated on the substrate. On the other hand, if the dissolution rate is too low, a so-called 'tailing phenomenon,' which is a phenomenon of flowing a partially dissolved photosensitive film tail, may occur in rinsing the photosensitive film coated on the substrate. In particular, since a diameter of the substrate is recently increased due to high integration and high densification of semiconductor integrated circuits, low revolution of a rotational speed (rpm) is unavoidable in a case of a rinsing process using a spin coater. In such a rinsing process, if a fluctuation occurs in the substrate due to the low revolution and the dissolution rate is not suitable within a contact rate of the thinner composition under injection, a bounding phenomenon may occur, and use of the thinner composition may be unnecessarily increased. As such, in the case of the low revolution rinsing process due to an increase in diameter of the substrate, it is necessary for the thinner to have a higher dissolution rate than any conventional high revolution rinsing process.

In addition, after removing the photosensitive resin, it is necessary for the thinner composition to be easily volatilized, and do not remain on the surface of a substrate. If the thinner composition cannot be volatilized but remain due to a very low volatility, the thinner residue itself may act as a contaminant in different processes, especially, a subsequent etching process, to cause a problem of decreasing the yield of semiconductor devices. On the other hand, if the volatility is too high, the substrate is quickly cooled to more increase a deviation in thickness of the coated photosensitive film, and the thinner may be easily volatilized into the atmosphere during use, thus causing a reduction in cleanliness.

Currently, i-line photoresist, KrF, ArF, EUV, KrF anti-reflection film, ArF anti-reflection film, and the like used as a photoresist in the semiconductor lithography process include different major components, respectively. Accordingly, controlling a content of an organic solvent for improving the solubility and applicabilities of these all components is required.

Korean Patent Laid-Open Publication No. 2011-21189 discloses a thinner composition including a hydrogen-bondable organic solvent, glycols, esters, and the like. In this regard, the composition has advantages of reducing an applying amount of photoresist, enabling uniform coating of the photoresist, and effectively removing undesirable photoresist applied to a peripheral portion or a rear portion of the substrate. However, due to the hydrogen bond, a viscosity of the thinner is increased but volatility is deteriorated to prevent volatilization of the thinner and remain the same on the substrate, hence leading to the tailing phenomenon at a photoresist removal interface. Furthermore, the thinner residue may act as obstructive particles in the subsequent process to cause a problem of reducing productivity of the production process.

Accordingly, there is a need for a thinner composition to have excellent solubility to various photoresist films, bottom anti-reflection coatings (BARCs), and underlayers, as well as favorable volatility, so as to exhibit excellent coating ability in applying photoresist, and thereby reducing an amount of the used photoresist.

SUMMARY

It is an object of the present invention to provide a thinner composition for a pre-treatment process of a wafer surface, in order to improve performance of photoresist application and reduce an amount of the used photoresist.

Another object of the present invention is to provide a thinner composition having excellent solubility and edge based removing (EBR) property to various photoresists, bottom anti-reflective coatings (BARCs), and underlayers, and also exhibiting excellent features in a reworking process (rework) of a wafer in which the photoresist is used.

The above objects of the present invention will be achieved by the following characteristics:

(1) A thinner composition including: propyleneglycol alkylether acetate, cycloketone and methyl 2-hydroxy isobutyrate.

(2) The thinner composition according to the above (1), wherein the propyleneglycol alkylether acetate is at least one selected from the group consisting of propyleneglycol methylether acetate, propyleneglycol ethylether acetate, propyleneglycol propylether acetate and propyleneglycol butylether acetate.

(3) The thinner composition according to the above (1), wherein the cycloketone has a Hansen solubility parameter of 9.0 or more.

(4) The thinner composition according to the above (1), wherein the cycloketone is at least one selected from the group consisting of cyclopropanone, cyclobutanone, cyclopentanone and cyclohexanone.

(5) The thinner composition according to the above (1), including: 30 to 70% by weight of propyleneglycol alkylether acetate, 1 to 20% by weight of cycloketone and 25 to 65% by weight of methyl 2-hydroxy isobutyrate.

(6) The thinner composition according to the above (1), including: 40 to 65% by weight of propyleneglycol alkylether acetate, 1 to 8% by weight of cycloketone and 35 to 55% by weight of methyl 2-hydroxy isobutyrate.

(7) The thinner composition according to the above (1), wherein the photoresist to be removed has a Hansen solubility parameter of 8 to 14.

(8) A method for treatment of a substrate, including treating the substrate with the thinner composition according to any one of the above (1) to (7) before applying a photoresist to the substrate.

(9) A method for treatment of a substrate, including treating the substrate with the thinner composition according to any one of the above (1) to (7) after applying a photoresist to the substrate but before exposure.

The thinner composition of the present invention is pretreated on the surface of a wafer before applying a photoresist to remarkably reduce an amount of the used photoresist (a reducing resist coating (RRC) performance), and improves applicability of the photoresist to thus enable uniform coating thereof.

The thinner composition of the present invention has excellent solubility and EBR performance to various photoresists, BARCs and underlayers. Therefore, the inventive thinner composition may be used in a reworking process of a wafer in which the photoresist is used.

The thinner composition of the present invention exhibits excellent solubility to main components of a photoresist and anti-reflective coating having a high polarity structure. Therefore, after completing EBR process, a rinsing process for the bottom of the wafer, and a pre-treatment process for the top of the wafer before applying the photoresist, contamination of a cup holder or blocking of an outlet in the coater does not occur.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

Figure 1A:
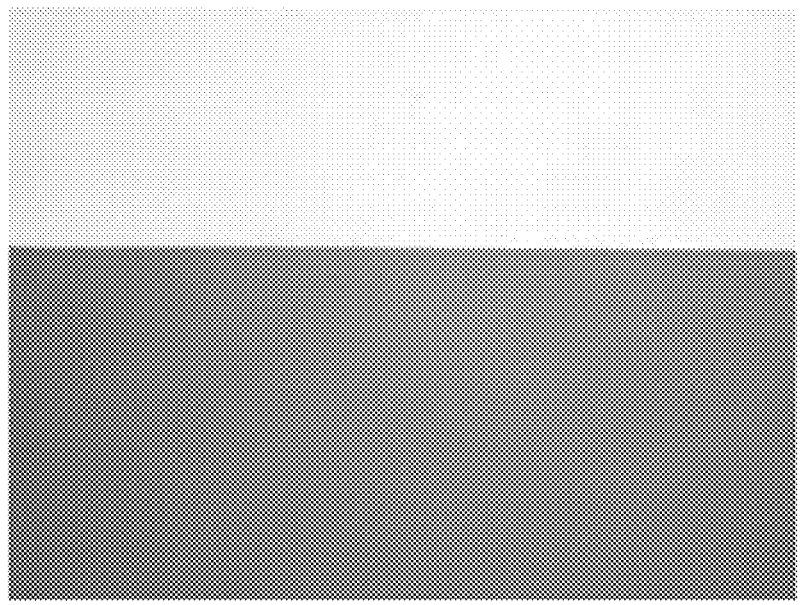
FIGS. 1A and 1B are photographs showing an excellent state (⊚) (FIG. 1A) and a poor state (X) during performing an EBR process (FIG. 1B)

The present invention discloses a thinner composition including: propyleneglycol alkylether acetate, cycloketone and methyl 2-hydroxy isobutyrate, thereby having excellent EBR, RRC, and rework properties, as well as effects of improving photoresist application uniformity, and in particular, exhibiting excellent solubility to photoresist having a high polarity, so as to be applicable to various photoresists.

Hereinafter, the present invention will be described in detail.

The thinner composition of the present invention includes propyleneglycol alkylether acetate, cycloketone, and methyl 2-hydroxy isobutyrate.

Propyleneglycol alkylether acetate is a component having high solubility to polymer, to thus exhibit excellent solubility to photoresist.

For example, the propyleneglycol alkylether acetate may contain an alkyl group having 1 to 10 carbon atoms, and more particularly, may include, for example, propyleneglycol methylether acetate, propyleneglycol ethylether acetate, propyleneglycol propylether acetate, propyleneglycol butylether acetate, and the like. Preferably, propyleneglycol methylether acetate is used. These compounds may be used alone or in combination of two or more thereof.

A content of propyleneglycol alkylether acetate is not particularly limited, and may be included in a range of 30 to 70% by weight ('wt. %') for example, and preferably, 40 to 65 wt. % to a total weight of the composition. If the content of propyleneglycol alkylether acetate is less than 30 wt. %, volatility of the composition is decreased and the thinner composition may remain on the substrate to hence contaminate the same. Further, the solubility to the photoresist is reduced, a RRC performance may be deteriorated, and an EBR performance may also be deteriorated. As a result, a rework performance and applicability of the photoresist may be reduced. If the content of thereof exceeds 70 wt. %, the volatility of the composition is increased and, as the thinner composition is volatilized, the substrate is quickly cooled to hence reduce the applicability of the photoresist and deteriorate the RRC performance. Further, the thinner composition does not sufficiently dilute the photoresist, BARC, etc. to deteriorate the EBR performance. As a result, similar to the above case, the rework performance and applicability of the photoresist may be reduced.

Cycloketone may increase the polarity of the thinner composition, thus improving not only solubility to a photoresist applied to a light source process such as G-line, I-line, etc., but also solubility to a high polarity photoresist applied to another light source such as KrF, ArF, etc. Furthermore, even in a case of a photoresist for spin-on-hardmask which has poor solubility to typical organic solvents, the inventive composition may exhibit excellent solubility.

Cycloketone used in the present invention may have a Hansen solubility parameter $[(cal/cm^3)^{1/2}]$ of at least 9. In such a case, the solubility to a high polarity photoresist is excellent, thus being preferable. An upper limit thereof is not particularly limited, and for example, may be 14.5.

The Hansen solubility parameter is one of methods for presuming a case in which a material is dissolved in another material to form a solution, which has been proposed by Charles Hansen. For example, this is a parameter disclosed in ⌐Industrial Solvents Handbook┐ (pp. 35-68, Marcel Dekker, Inc., published on 1996) or ⌐Directory of Solvents┐ (pp. 22-29, Blackie Academic & Professional, published on 1996), etc.

Cycloketone may have a ring having 3 to 20 carbon atoms, and may include, for example, cyclopropanone, cyclobutanone, cyclopentanone and cyclohexanone. Preferably, cyclopentanone or cyclohexanone may be used, and more preferably, cyclopentanone may be used. These compounds may be used alone or in combination of two or more thereof.

A content of cycloketone is not particularly limited, but may include, for example, range from 1 to 20 wt. %, and preferably, 1 to 8 wt. % to a total weight of the composition. If the content of cycloketone is less than 1 wt. %, effects of improving the solubility to a high polarity photoresist may be negligible. Therefore, the rework performance may also be reduced. If the content of cycloketone exceeds 20 wt. %, the volatility is increased and, as the thinner composition is volatilized, the substrate is quickly cooled to hence reduce the applicability of the photoresist and deteriorate RRC performance. Further, since the thinner composition does not sufficiently dilute the photoresist, BARC, etc. to deteriorate the EBR performance, as similar to the above case, the rework performance and applicability of the photoresist may be reduced.

Methyl 2-hydroxy isobutyrate is a component of improving solubility of the photoresist to a photosensitive agent.

A content of methyl 2-hydroxy isobutyrate is not particularly limited, and may be included in a range of 25 to 65 wt. % for example, and preferably, 35 to 55 wt. % to a total weight of the composition. If the content of methyl 2-hydroxy isobutyrate is less than 25 wt. %, the viscosity of the composition is decreased to cause a problem of not sufficiently binding the photoresist and BARC, hence deteriorating the RRC performance. Further, the EBR performance may also be deteriorated. As a result, the rework performance and applicability of the photoresist may be reduced. If the content thereof exceeds 65 wt. %, the volatility and viscosity of the composition are increased, therefore, smooth modification (application) is difficult when applying the same to a substrate to deteriorate the RRC and EBR performances. As a result, similar to the above case, the rework performance and applicability of the photoresist may be reduced.

As described above, the present invention uses propyleneglycol alkylether acetate together with 2-hydroxy isobutyrate, thus enabling the composition to have appropriate volatility and excellent solubility. Therefore, the RRC and EBR performances may be improved. Further, since cycloketone is also used, the solubility to a photoresist applied to a light source process such as G-line, I-line, etc., as well as the solubility to a high polarity photoresist applied to a light source process such as KrF, ArF, etc. may be improved. In addition, even to a photoresist for spin-on-hardmask process having poor solubility to typical organic solvents, excellent solubility may be achieved. Moreover, the rework performance and applicability of the photoresist may be remarkably improved.

The thinner composition of the present invention may exhibit superior effects in expressing uniform applicability on a silicon wafer in regard to various photoresist films and BARCs and, at the same time, may show superior RRC, EBR, and rework properties based on excellent solubility. In particular, in the case of a photoresist for i-line, KrF, ArF, ArF immersion, etc., the photosensitive resin has different basic structures. Therefore, it is necessary to control a constitutional content of an organic solvent in order to enhance the applicability and solubility of these all components. However, the thinner composition of the present invention may exhibit excellent EBR and RRC performances to all of such various photoresists.

The thinner composition of the present invention may have superior solubility to a high polarity photoresist applied to a light source process such as KrF, ArF, etc. and a photoresist for spin-on-hardmask process, which has poor solubility to typical organic solvents, therefore, the photoresist as a subject to be applied may have high polarity, for example, the Hansen solubility parameter may range from 8 to 14, and preferably, from 9.5 to 14, however, it is not particularly limited thereto.

In addition, the present invention provides a method for treatment of a substrate using the thinner composition according to the present invention.

The method for treatment of a substrate according to the present invention includes treating the substrate with the thinner composition before applying a photoresist to the substrate.

After treating the substrate with the thinner composition, the photoresist is applied thereto. Accordingly, the substrate may be coated only using a small amount of photoresist, and thereby enhancing process costs and productivity.

A method for treatment of a substrate using a thinner composition is not particularly limited but may include, for example, impregnating the substrate with the thinner composition or applying the thinner composition to the substrate.

After treating the substrate with the thinner composition, a photoresist may be applied to the substrate.

Alternatively, the method of treating the substrate according to the present invention may include treating the substrate with the thinner composition after applying a photoresist to the substrate but before exposure.

Since the substrate is treated using the thinner composition in the above step, undesirable photoresist applied at the peripheral portion or rear portion of the substrate may be quickly and effectively removed before exposure.

The method for treatment of a substrate using a thinner composition is not particularly limited, and may include impregnating the substrate with the thinner composition or applying the thinner composition to the substrate, for example.

The method for treatment of a substrate according to the present invention may be applicable to any method for manufacturing a product having photoresist used therein, for example, a method for manufacturing an electronic device, without particular limitation thereof. For example, the present inventive method may be used in a method for manufacturing a semiconductor device or a thin film transistor liquid crystal display device.

The inventive method may further include a step of treating the substrate with the thinner composition before applying the photoresist to the substrate and, in this case, may achieve preferable advantages described above.

Hereinafter, preferred embodiments are proposed to more concretely describe the present invention. However, the following examples are only given for illustrating the present invention and those skilled in the art will obviously understand that various alterations and modifications are possible within the scope and spirit of the present invention. Such alterations and modifications are duly included in the appended claims.

EXAMPLES AND COMPARATIVE EXAMPLES

A thinner composition was prepared by adding components stated in Table 1 below to a mixing tank equipped with an agitator, then, agitating the mixture at room temperature and 500 rpm for 1 hour.

<Standard for assessment>

⊚: constant EBR line uniformity to the photosensitive film after EBR (FIG. 1A)

Figure 1B:
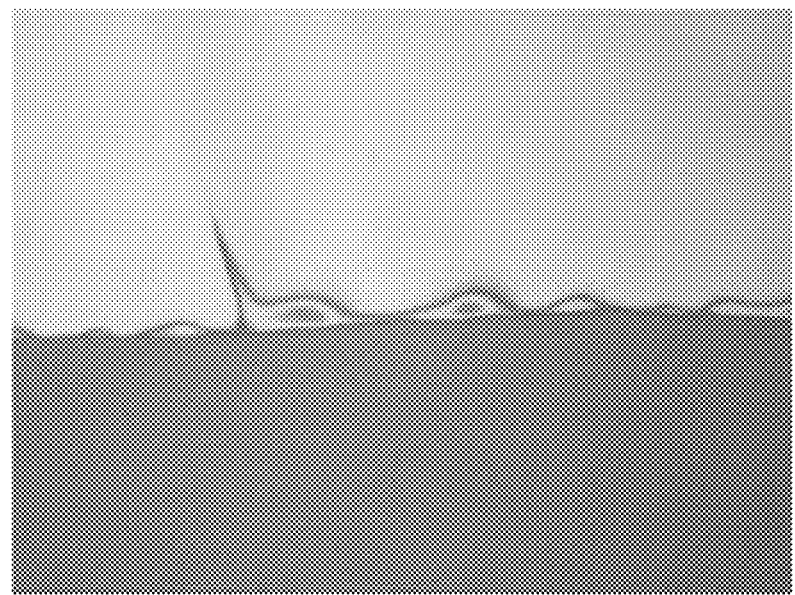

○: favorable straight line state with EBR line uniformity of 75% or more to the photosensitive film after EBR Δ: distorted shape of edge portion due to dissolution of thinner after EBR X : occurred tailing at edge portion after EBR (FIG. 1B)

TABLE 1

| Section | Propyleneglycol alkylether acetate | | Cycloketone | | Methyl 2-hydroxy isobutyrate | | Others | |
|---|---|---|---|---|---|---|---|---|
| | Component | Wt. part | Component | Wt. part | component | Wt. part | Component | Wt. part |
| Example 1 | A-1 | 55 | B-1 | 5 | C-1 | 40 | — | — |
| Example 2 | A-1 | 40 | B-1 | 5 | C-1 | 55 | — | — |
| Example 3 | A-1 | 65 | B-1 | 5 | C-1 | 30 | — | — |
| Example 4 | A-1 | 55 | B-1 | 1 | C-1 | 44 | — | — |
| Example 5 | A-1 | 55 | B-1 | 10 | C-1 | 35 | — | — |
| Example 6 | A-1 | 55 | B-2 | 5 | C-1 | 40 | — | — |
| Example 7 | A-1 | 55 | B-1/B-2 | 3.5/1.5 | C-1 | 40 | — | — |
| Example 8 | A-1 | 55 | B-1 | 8 | C-1 | 37 | — | — |
| Comparative Example 1 | A-1 | 100 | — | — | — | — | — | — |
| Comparative Example 2 | — | — | B-1 | 100 | — | — | — | — |
| Comparative Example 3 | — | — | — | — | C-1 | 100 | — | — |
| Comparative Example 4 | — | — | B-1 | 50 | C-1 | 50 | — | — |
| Comparative Example 5 | A-1 | 50 | — | — | C-1 | 50 | — | — |
| Comparative Example 6 | A-1 | 50 | B-1 | 50 | — | — | — | — |
| Comparative Example 7 | A-1 | 50 | — | — | C-1 | 40 | D-1 | 10 |
| Comparative Example 8 | A-1 | 40 | — | — | C-1 | 40 | D-1 | 20 |
| Comparative Example 9 | A-1 | 55 | — | — | C-1 | 40 | D-2 | 5 |
| Comparative Example 10 | — | — | B-1 | 5 | C-1 | 40 | D-1 | 55 |

A-1: propyleneglycol monomethylether acetate (PGMEA)
B-1: cyclopentanone (CPN), Hansen solubility parameter (10.8)
B-2: cyclohexanone (CHN), Hansen solubility parameter (9.6)
C-1: methyl 2-hydroxy iso-butyrate (HBM)
D-1: propylneglycol monomethyl ether (PGME)
D-2: 2-heptanone (MAKN), Hansen solubility parameter (8.7)

Experimental Example

1. Experiment for Removal of Undesirable Photosensitive Film Using a Thinner Composition for a Photosensitive Resin composition (an edge bead removing (EBR) experiment)

After applying the photosensitive resin listed in Table 2 below to an 8-inch silicon oxide substrate, the EBR experiment was executed using each of the thinner compositions in the examples and comparative examples, respectively, in order to remove an undesirable photosensitive film at edge portions. Each of the thinner compositions in the examples and comparative examples was supplied from a pressure tank equipped with a pressure meter wherein a pressure was 1 kgf, and a flow rate of the thinner composition fed from EBR nozzles was set in a range of 10 to 30 cc/min. Further, performance of removing the undesirable photosensitive film was evaluated using an optic microscope, and results thereof are shown in Table 4 below.

TABLE 2

| Section | PR type | Hansen solubility parameter $((cal/cm^3)^{1/2})$ |
|---|---|---|
| PR 1 | PR for ArF | 9.5-14 |
| PR 2 | PR for ArF-immersion | 10-14 |
| PR 3 | PR for i-line | 8-11.5 |
| PR 4 | PR for KrF | 9-12 |
| BARC | BARC for ArF | 10-14 |

TABLE 3

| Section | Rotational speed (rpm) | Time (Sec) |
|---|---|---|
| Dispense condition | 300-2000 | 7 |
| Spin coating | Controlled based on thickness of photosensitive film | 15 |

TABLE 3-continued

| Section | Rotational speed (rpm) | Time (Sec) |
| --- | --- | --- |
| EBR condition 1 | 2000 | 20 |
| EBR condition 2 | 2000 | 25 |
| Dry condition | 1300 | 6 |

TABLE 4

| Section | PR1 (1.0 cc) | PR2 (1.0 cc) | PR3 (1.0 cc) | PR4 (1.0 cc) | BARC (0.4 cc) |
| --- | --- | --- | --- | --- | --- |
| Example 1 | ◉ | ◉ | ◉ | ◉ | ◉ |
| Example 2 | ◉ | ◉ | ◉ | ◉ | ◉ |
| Example 3 | ◉ | ◉ | ◉ | ○ | ◉ |
| Example 4 | ◉ | ◉ | ◉ | ◉ | ◉ |
| Example 5 | ◉ | ◉ | ○ | ◉ | ◉ |
| Example 6 | ○ | ○ | ◉ | ◉ | ◉ |
| Example 7 | ◉ | ◉ | ◉ | ○ | ◉ |
| Example 8 | ◉ | ◉ | ◉ | ◉ | ◉ |
| Comparative Example 1 | X | X | X | X | X |
| Comparative Example 2 | X | X | X | X | X |
| Comparative Example 3 | X | X | X | X | X |
| Comparative Example 4 | Δ | Δ | X | X | X |
| Comparative Example 5 | X | X | X | X | X |
| Comparative Example 6 | Δ | Δ | X | X | X |
| Comparative Example 7 | X | X | Δ | Δ | Δ |
| Comparative Example 8 | X | X | Δ | Δ | Δ |
| Comparative Example 9 | Δ | Δ | Δ | Δ | Δ |
| Comparative Example 10 | Δ | X | X | X | Δ |

Referring to Table 4, it could be seen that the thinner compositions in the examples according to the present invention exhibited excellent EBR performance to all photosensitive films, while the comparative examples demonstrated that removal property was considerably reduced, compared to the thinner composition of the present invention. From these results, it may be understood that EBR performance for four types of photoresists and BARC is fully satisfied.

Further, even in a case in which the rotational speed (rpm) condition of EBR was varied, equal and excellent morphologies were retained. This result means that the thinner composition according to the present invention could have not only desirable effects under specific conditions, but also exhibit the same performance under different conditions, thereby being more stable against a change in process conditions, compared to conventional thinner compositions.

2. Assessment of a Reducing Resist Coating (RRC) Performance Depending on Photoresist Type and BARC Using each of the thinner compositions in the examples and comparative example, experiment for RRC performance to four types of photoresists and BARC listed in Table 2 was executed. According to the recipe stated in Table 5 below, before applying the following five types of photoresists, each of the thinner compositions was first applied, followed by conducting a RRC process of measuring application distribution and consumed amount of the photoresist to the thinner after applying the same. Similarly, for BARC, the RRC process using each of the thinner compositions was executed in a state without heat treatment. Table 6 below shows results of consumed amount of the photoresist, which were measured after applying 0.5 cc of thinner to an 8-inch wafer, then, 1.0 cc of PR1 to 4 and 0.4 cc of BARC, respectively, to the same.

<Standard for Assessment>

Figure 2A:
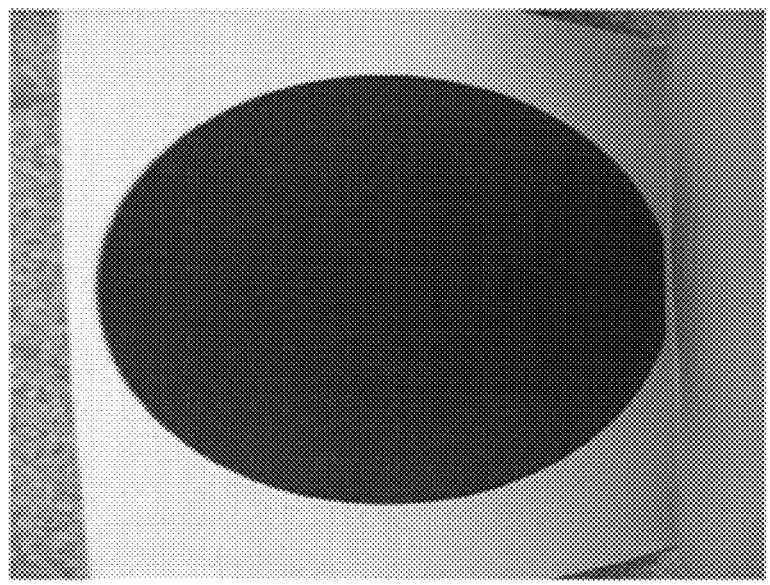
FIGS. 2A and 2B are photographs showing an excellent state (⊚) (FIG. 2A) and a poor state (X) during performing a RRC process (FIG. 2B)

◉: 99 to 100% application of photoresist on 8-inch wafer when applying 0.5 cc thinner to the wafer and then spreading the photoresist thereon, as a result of RRC (FIG. 2A)

Figure 2B:
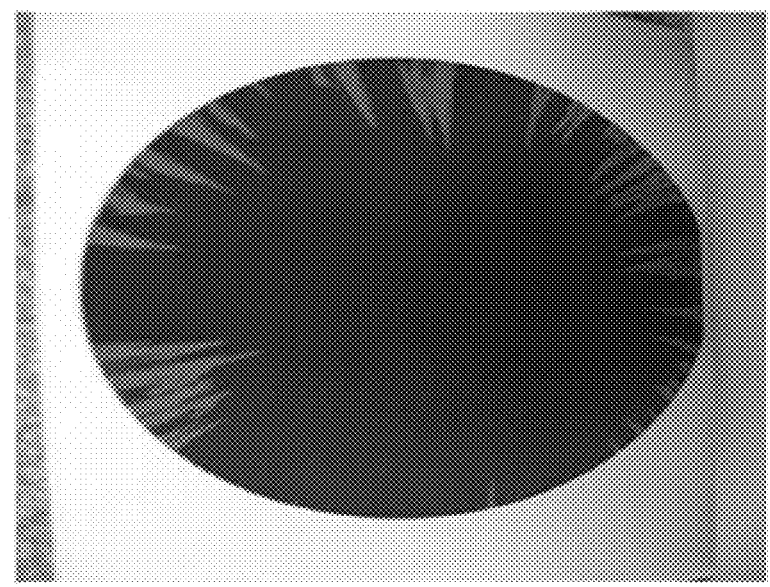

○: 97 to less than 99% application of photoresist on 8-inch wafer when applying 0.5 cc thinner to the wafer and then spreading the photoresist thereon, as a result of RRC Δ: 85 to less than 97% application of photoresist on 8-inch wafer when applying 0.5 cc thinner to the wafer and then spreading the photoresist thereon, as a result of RRC X: less than 85% application of photoresist on 8-inch wafer when applying 0.5 cc thinner to the wafer and then spreading the photoresist thereon, as a result of RRC (FIG. 2B)

TABLE 5

| Step | Time (sec) | Speed (rpm) | Axel (rpm/sec) | Dispense (cc) |
| --- | --- | --- | --- | --- |
| 1 | 2.5 | 0 | 10,000 | 0.5 (Thinner) |
| 2 | 1.5 | 900 | 10,000 | 0 |
| 3 | 9.5 | 1500 | 10,000 | 0 |
| 4 | 5.0 | 600 | 10,000 | 0.5-1 (PR) |
| 5 | 5.0 | 1500 | 10,000 | 0 |
| 6 | 10.0 | 1000 | 10,000 | 0 |

TABLE 6

| Section | PR1 (1.0 cc) | PR2 (1.0 cc) | PR3 (1.0 cc) | PR4 (1.0 cc) | BARC (0.4 cc) |
| --- | --- | --- | --- | --- | --- |
| Example 1 | ◉ | ◉ | ◉ | ◉ | ◉ |
| Example 2 | ◉ | ◉ | ◉ | ◉ | ◉ |
| Example 3 | ◉ | ◉ | ○ | ◉ | ◉ |
| Example 4 | ◉ | ◉ | ◉ | ◉ | ◉ |
| Example 5 | ◉ | ◉ | ◉ | ○ | ◉ |
| Example 6 | ○ | ○ | ○ | ◉ | ◉ |
| Example 7 | ◉ | ◉ | ◉ | ◉ | ◉ |
| Example 8 | ◉ | ◉ | ◉ | ◉ | ◉ |
| Comparative Example 1 | X | X | X | X | X |
| Comparative Example 2 | X | X | X | X | X |
| Comparative Example 3 | X | X | X | X | X |
| Comparative Example 4 | Δ | Δ | X | X | X |
| Comparative Example 5 | X | X | X | X | X |
| Comparative Example 6 | Δ | Δ | X | X | X |
| Comparative Example 7 | X | X | Δ | Δ | Δ |
| Comparative Example 8 | X | X | Δ | Δ | Δ |
| Comparative Example 9 | Δ | X | Δ | Δ | Δ |
| Comparative Example 10 | Δ | Δ | X | X | Δ |

Referring to Table 6, it could be seen that the thinner compositions in the examples according to the present invention had excellent RRC performance to all photosensitive films, while the comparative examples demonstrated that applicability was considerably deteriorated in regard to improvement of applicability of photoresist and BAC, compared to the thinner compositions of the present invention in the examples. Further, even when changing the rotational speed (rpm) conditions of RRC, excellent morphologies were equally maintained without alteration thereof. This result means that the thinner composition of the present invention could have not only desirable effects under specific conditions, but also exhibit the same performance under different conditions, thereby being more stable against a change in process conditions, compared to conventional thinner compositions.

3. Assessment of Coating Uniformity Depending on Photoresist Type

Figure 3:
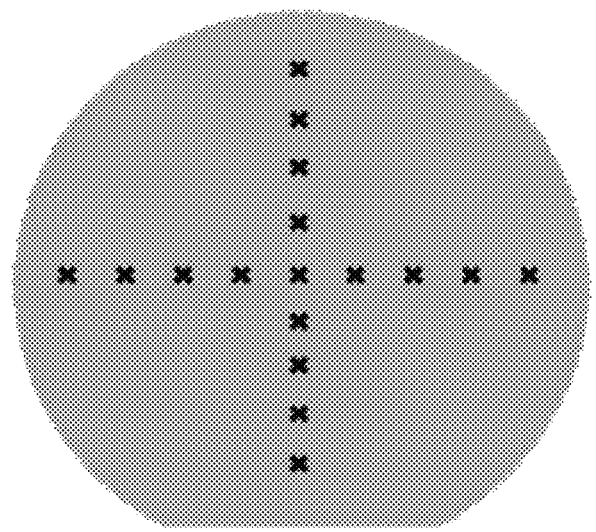
FIG. 3 illustrates a point at which coating uniformity is evaluated in a wafer for 8-inch silicon oxide substrate.

Using each of the thinner compositions in the examples and comparative examples, respectively, experiments for coating uniformity to four types of photoresists and BARC listed in Table 2 were executed. According to the recipe stated in Table 7 below, a photoresist was applied to an 8-inch silicon oxide substrate. Then, after indicating a site at a center of a wafer and 16 sites at 1-inch, 2-inch, 3-inch and 4-inch distances from the center of the same by 'X' mark, total 17 sites (see FIG. 3) were subjected to measurement to confirm whether the photoresist was uniformly applied or not. Results thereof are shown in Table 8 below.

<Standard for assessment>

◎: 1% or less of standard deviation of coating film thickness

○: more than 1% to 2% or less of standard deviation of coating film thickness

Δ: more than 2% to 3% of standard deviation of coating film thickness

X : more than 3% of standard deviation of coating film thickness

TABLE 7

| Step | Time (sec) | Speed (rpm) | Axel (rpm/sec) | Dispense (cc) |
|---|---|---|---|---|
| 1 | 5 | 0 | 10,000 | 2.0 (Thinner) |
| 2 | 5 | 700 | 10,000 | 0 |
| 3 | 3 | 2,000 | 10,000 | 0 |
| 4 | 20 | 2,000 | 10,000 | 0.30 (PR) |
| 5 | 5 | 700 | 10,000 | 0 |
| 6 | 5 | 0 | 10,000 | 0 |

TABLE 8

| Section | PR1 (1.0 cc) | PR2 (1.0 cc) | PR3 (1.0 cc) | PR4 (1.0 cc) | BARC (0.4 cc) |
|---|---|---|---|---|---|
| Example 1 | ◎ | ◎ | ◎ | ◎ | ◎ |
| Example 2 | ◎ | ◎ | ◎ | ◎ | ◎ |
| Example 3 | ◎ | ◎ | ◎ | ○ | ◎ |
| Example 4 | ◎ | ◎ | ◎ | ◎ | ◎ |
| Example 5 | ◎ | ◎ | ○ | ◎ | ◎ |
| Example 6 | ○ | ○ | ○ | ◎ | ◎ |
| Example 7 | ◎ | ◎ | ◎ | ◎ | ◎ |
| Example 8 | ◎ | ◎ | ◎ | ◎ | ◎ |
| Comparative Example 1 | X | X | X | X | X |
| Comparative Example 2 | X | X | X | X | X |
| Comparative Example 3 | X | X | X | X | X |
| Comparative Example 4 | Δ | Δ | X | X | X |
| Comparative Example 5 | X | X | X | X | X |
| Comparative Example 6 | Δ | Δ | X | X | X |
| Comparative Example 7 | X | X | Δ | Δ | Δ |
| Comparative Example 8 | X | X | Δ | Δ | Δ |
| Comparative Example 9 | Δ | X | Δ | Δ | Δ |
| Comparative Example 10 | Δ | Δ | X | X | Δ |

Referring to Table 8, it could be seen that the thinner compositions in the examples according to the present invention had uniform coating film thickness in all photosensitive films, while the comparative examples demonstrated that coating uniformity was considerably decreased, compared to the thinner composition of the present invention in the examples.

4. Assessment of Rework Performance Depending on Photoresist Type

Using each of the thinner compositions in the examples and comparative examples, respectively, rework performance to four types of photoresists and BARC listed in Table 2 was executed. According to the recipe stated in Table 9 below, one of six types of photoresists was applied to an 8-inch silicon oxide substrate. Then, a wafer obtained after completing a soft-baking process was subjected to a reworking process using each thinner composition. For BARC case, in a state without heat treatment after application, each of the thinner compositions was used to execute the reworking process.

Using a surface scan device manufactured by Topcon Co. (Model name: WM-1500), the surface condition of the reworked silicon oxide substrate was evaluated. Results of the evaluation are shown in Table 10 below.

<Standard for Assessment>

◎: as a result of surface scanning, the reworked silicon oxide has less than 1000 surface particles, ○: as a result of surface scanning, the reworked silicon oxide has 1000 or more but less than 2000 surface particles, Δ: as a result of surface scanning, the reworked silicon oxide has 2000 or more but less than 3000 surface particles, X : as a result of surface scanning, the reworked silicon oxide has 3000 or more surface particles.

TABLE 9

| Step | Time (sec) | Speed (rpm) | Axel (rpm/sec) | Dispense (cc) |
|---|---|---|---|---|
| 1 | 2 | 0 | 10,000 | 0 |
| 2 | 2 | 1000 | 10,000 | 0 |
| 3 | 4 | 1000 | 10,000 | 2.0 (Thinner) |
| 4 | 9.5 | 4000 | 10,000 | 0 |
| 5 | 0 | 0 | 10,000 | 0 |

TABLE 10

| Section | PR1 (1.0 cc) | PR2 (1.0 cc) | PR3 (1.0 cc) | PR4 (1.0 cc) | BARC (0.4 cc) |
|---|---|---|---|---|---|
| Example 1 | ◎ | ◎ | ◎ | ◎ | ◎ |
| Example 2 | ◎ | ◎ | ◎ | ◎ | ◎ |
| Example 3 | ◎ | ◎ | ○ | ◎ | ◎ |
| Example 4 | ◎ | ◎ | ◎ | ◎ | ◎ |
| Example 5 | ◎ | ◎ | ◎ | ○ | ◎ |
| Example 6 | ○ | ○ | ◎ | ◎ | ◎ |
| Example 7 | ◎ | ◎ | ◎ | ○ | ◎ |
| Example 8 | ◎ | ◎ | ◎ | ◎ | ◎ |

TABLE 10-continued

| Section | PR1 (1.0 cc) | PR2 (1.0 cc) | PR3 (1.0 cc) | PR4 (1.0 cc) | BARC (0.4 cc) |
|---|---|---|---|---|---|
| Comparative Example 1 | X | X | X | X | X |
| Comparative Example 2 | X | X | X | X | X |
| Comparative Example 3 | X | X | X | X | X |
| Comparative Example 4 | Δ | Δ | X | X | X |
| Comparative Example 5 | X | X | X | X | X |
| Comparative Example 6 | Δ | Δ | X | X | X |
| Comparative Example 7 | X | X | Δ | Δ | Δ |
| Comparative Example 8 | X | X | Δ | Δ | Δ |
| Comparative Example 9 | Δ | Δ | Δ | Δ | Δ |
| Comparative Example 10 | Δ | X | X | X | Δ |

Referring to Table 10, it could be seen that the thinner compositions in the examples according to the present invention had small number of surface particles to show excellent rework performance, while the comparative examples demonstrated that a plurality of particles residue had existed to exhibit deteriorated rework performance, compared to the thinner compositions of the present invention.

Although the present invention has been described with reference to exemplary embodiments for illustrative purposes, the present invention is not limited to the specific embodiments but should be construed according to the accompanying claims. In addition, those skilled in the art will appreciate that various modifications, additions and substitutions are possible, without departing from the scope and spirit of the invention as disclosed in the accompanying claims.

What is claimed is:

1. A thinner composition comprising:
    40 to 65% by weight of propyleneglycol alkylether acetate, based on the total weight of the thinner composition;
    1 to 8% by weight of cycloketone, based on the total weight of the thinner composition; and
    35 to 55% by weight of methyl 2-hydroxy isobutyrate, based on the total weight of the thinner composition.

2. The thinner composition according to claim 1, wherein the propyleneglycol alkylether acetate is at least one selected from the group consisting of propyleneglycol methylether acetate, propyleneglycol ethylether acetate, propyleneglycol propylether acetate and propyleneglycol butylether acetate.

3. The thinner composition according to claim 1, wherein the cycloketone has a Hansen solubility parameter of 9.0 or more.

4. The thinner composition according to claim 1, wherein the cycloketone is at least one selected from the group consisting of cyclopropanone, cyclobutanone, cyclopentanone and cyclohexanone.

5. A method for treatment of a substrate, the method comprising:
    treating the substrate with the thinner composition according to claim 1; and
    applying a photoresist to the substrate before the treatment of the substrate with the thinner composition or after the treatment of the substrate with the thinner composition.

6. The method for treatment of claim 5, wherein the photoresist is applied to the substrate before the treatment of the substrate with the thinner composition.

7. The method for treatment of claim 5, wherein the photoresist is applied to the substrate after the treatment of the substrate with the thinner composition.

8. The method of claim 7, wherein the photoresist has a Hansen solubility parameter of 8 to 14.

* * * * *